United States Patent
Windisch et al.

(10) Patent No.: US 10,418,530 B2
(45) Date of Patent: Sep. 17, 2019

(54) OPTOELECTRONIC SEMICONDUCTOR CHIP, METHOD FOR PRODUCING AN OPTOELECTRONIC SEMICONDUCTOR CHIP, CONVERSION ELEMENT AND PHOSPHOR FOR A CONVERSION ELEMENT

(71) Applicant: OSRAM Opto Semiconductors GmbH, Regensburg (DE)

(72) Inventors: Reiner Windisch, Pettendorf (DE); Joerg Erich Sorg, Regensburg (DE); Ralph Wirth, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/531,349

(22) PCT Filed: Nov. 25, 2015

(86) PCT No.: PCT/EP2015/077637
§ 371 (c)(1),
(2) Date: May 26, 2017

(87) PCT Pub. No.: WO2016/083448
PCT Pub. Date: Jun. 2, 2016

(65) Prior Publication Data
US 2017/0358718 A1 Dec. 14, 2017

(30) Foreign Application Priority Data
Nov. 27, 2014 (DE) .......................... 10 2014 117 448

(51) Int. Cl.
*H01L 33/50* (2010.01)
*H01L 21/02* (2006.01)
(Continued)

(52) U.S. Cl.
CPC ...... *H01L 33/505* (2013.01); *H01L 21/02639* (2013.01); *H01L 24/24* (2013.01);
(Continued)

(58) Field of Classification Search
CPC . H01L 21/02639; H01L 24/24; H01L 33/505; H01L 33/507; H01L 33/508; H01L 33/56; H01L 33/58
(Continued)

(56) References Cited

U.S. PATENT DOCUMENTS 7,476,337 B2 * 1/2009 Sakane ............. C09K 11/0883
252/301.4 F
9,725,646 B2 * 8/2017 Fiedler ............... C09K 11/7728
(Continued)

FOREIGN PATENT DOCUMENTS

DE 102012107290 A1 2/2014
DE 102012110552 A1 5/2014
(Continued)

*Primary Examiner* — Mohammed Shamsuzzaman
(74) *Attorney, Agent, or Firm* — McDermott Will & Emery LLP (57) ABSTRACT

An optoelectronic semiconductor chip having a semiconductor body (1) that is suitable for emitting electromagnetic radiation in a first wavelength range from a radiation exit face (3) is specified. Furthermore, the semiconductor chip comprises a ceramic or monocrystalline conversion platelet (6) that is suitable for converting electromagnetic radiation in the first wavelength range into electromagnetic radiation in a second wavelength range, which is different from the first wavelength range, and a wavelength-converting joining layer (7) that connects the conversion platelet (6) to the radiation exit face (3), wherein the wavelength-converting joining layer (7) has luminescent material particles (4) that are suitable for converting radiation in the first wavelength range into radiation in a third wavelength range, which is different from the first wavelength range and the second
(Continued)

wavelength range. The wavelength-converting joining layer (7) furthermore has a thickness of no more than 30 micrometers. A method for fabricating an optoelectronic semiconductor chip, a further semiconductor chip, conversion element and luminescent material are specified.

9 Claims, 5 Drawing Sheets (51) Int. Cl.
    *H01L 23/00* (2006.01)
    *H01L 33/56* (2010.01)
    *H01L 33/58* (2010.01)

(52) U.S. Cl.
    CPC ............ *H01L 33/50* (2013.01); *H01L 33/507* (2013.01); *H01L 33/508* (2013.01); *H01L 33/56* (2013.01); *H01L 33/58* (2013.01)

(58) Field of Classification Search
    USPC .............................. 257/88, 98; 313/502, 503
    See application file for complete search history.

(56) References Cited

U.S. PATENT DOCUMENTS

| | | | |
|---|---|---|---|
| 2008/0191609 A1 | 8/2008 | Schmidt et al. | |
| 2009/0072255 A1* | 3/2009 | Takahashi | C09K 11/584 257/98 |
| 2011/0133631 A1* | 6/2011 | Berben | H01L 33/504 313/502 |
| 2012/0098017 A1 | 4/2012 | Komatsu et al. | |
| 2013/0193836 A1* | 8/2013 | Seibel, II | H01L 33/504 313/498 |
| 2014/0008683 A1 | 1/2014 | Petersen et al. | |
| 2015/0318451 A1* | 11/2015 | Ishida | C09K 11/7734 257/98 |
| 2016/0312118 A1* | 10/2016 | Fiedler | C09K 11/7728 |
| 2016/0326430 A1* | 11/2016 | Fiedler | C09K 11/7728 |

FOREIGN PATENT DOCUMENTS

| | | |
|---|---|---|
| WO | WO-2014013406 A1 | 1/2014 |
| WO | WO-2015/052238 A1 | 4/2015 |

\* cited by examiner

| Si1/Al1- | N1 | 175 pm | Si2/Al2- | N1 | 202 pm | Si3/Al3- | N1 | 169 pm |
|---|---|---|---|---|---|---|---|---|
| | N2 | 181 pm | | N2 | 176 pm | | N3 | 194 pm |
| | N3 | 188 pm | | N4 | 178 pm | | N4 | 183 pm |
| | N5 | 182 pm | | N6 | 171 pm | | N5 | 167 pm |
| Si4/Al4- | N2 | 187 pm | Sr1 | N1 | 259 pm | Sr2/Ca2 | N2 | 250 pm |
| | N3 | 159 pm | | N3 | 263 pm | | N4 | 281 pm |
| | N4 | 202 pm | | N5_1 | 264 pm | | N6_1 | 253 pm |
| | N6 | 192 pm | | N5_2 | 270 pm | | N6_2 | 272 pm |
| | | | | N5_3 | 277 pm | | N6_3 | 263 pm |
| | | | | N5_4 | 297 pm | | | |

OPTOELECTRONIC SEMICONDUCTOR CHIP, METHOD FOR PRODUCING AN OPTOELECTRONIC SEMICONDUCTOR CHIP, CONVERSION ELEMENT AND PHOSPHOR FOR A CONVERSION ELEMENT

An optoelectronic semiconductor chip and a method for producing same are defined. A conversion element and an optoelectronic semiconductor chip comprising a conversion element are also defined. A phosphor is defined.

Document US 2012/0098017 A1, for example, describes an optoelectronic semiconductor chip.

An object of the present invention is to define an optoelectronic semiconductor chip that comprises a semiconductor body and a conversion element and is as efficient as possible. It is also an object of the invention to define a method for producing an optoelectronic semiconductor chip of this type.

Another object of the present invention is to define a particularly efficient conversion element for generating warm-white light. The conversion element shall preferably be suitable for generating warm-white light of color temperature between 2000 K and 4500 K inclusive, more preferably between 2500 K and 3500 K inclusive. A further object is to define a phosphor that is suitable in particular for use in the conversion element.

These objects are achieved by optoelectronic semiconductor chip having certain ones of the features disclosed herein.

The respective dependent claims describe advantageous embodiments and developments of the optoelectronic semiconductor chip, of the method for producing an optoelectronic semiconductor chip and of the conversion element.

An optoelectronic semiconductor chip comprises in particular a semiconductor body suitable for emitting electromagnetic radiation in a first wavelength region from a radiation exit surface. The optoelectronic semiconductor chip also comprises a ceramic or monocrystalline conversion plate suitable for converting electromagnetic radiation in the first wavelength region into electromagnetic radiation in a second wavelength region, which differs from the first wavelength region. The ceramic conversion plate comprises or is made of a ceramic, for example. The monocrystalline conversion plate comprises or is made of a monocrystalline material, for example. The ceramic conversion plate or the monocrystalline conversion plate preferably does not contain a matrix material such as a silicone or an epoxy.

According to an embodiment of the semiconductor chip, the conversion plate is bonded to the radiation exit surface of the semiconductor body by a wavelength-converting joining layer. In particular, the wavelength-converting joining layer achieves a mechanically robust bond between the semiconductor body and the conversion plate. Particularly preferably, the wavelength-converting joining layer comprises an adhesive as the joining material. A resin, for instance a silicone or epoxy or a mix of these materials, can be used as the joining material.

The term "wavelength converting" is intended here in particular in the sense that incident electromagnetic radiation in a certain wavelength region is converted into electromagnetic radiation in another wavelength region, preferably of longer wavelength. A wavelength-converting element typically absorbs electromagnetic radiation in an incident wavelength range, converts this radiation by electronic processes at the atomic and/or molecular level into electromagnetic radiation in another wavelength region, and re-emits the converted electromagnetic radiation.

According to an embodiment of the semiconductor chip, the wavelength-converting joining layer comprises phosphor particles which are suitable for converting radiation in the first wavelength region into radiation in a third wavelength region, which differs from the first wavelength region and from the second wavelength region. In other words, the phosphor particles impart the wavelength-converting properties to the wavelength-converting joining layer. Particularly preferably, the phosphor particles are incorporated in the joining material.

The wavelength-converting joining layer preferably has a maximum thickness of 30 micrometers. The small thickness of the wavelength-converting joining layer means it is possible to dissipate particularly efficiently the heat that is produced during conversion of the primary radiation in the first wavelength region into radiation in the third wavelength region inside the phosphor particles. Particularly efficient operation of the semiconductor chip is thereby possible.

The wavelength-converting joining layer particularly preferably has a thickness of 20 micrometers maximum, 15 micrometers maximum or 10 micrometers maximum. It is an inherent feature of fabrication here that the thickness of the wavelength-converting joining layer can vary over its entire surface. When this document refers to a "thickness" of the wavelength-converting joining layer, it is intended in the sense of the arithmetic mean. Individual measured values of the thickness deviate from the arithmetic mean preferably by not more than 50%, more preferably by not more than 30%.

The thinner the wavelength-converting joining layer is designed to be, the better the heat produced during operation can be dissipated out of the wavelength-converting joining layer into the semiconductor body. In addition, it is not only the heat produced during operation that is advantageously dissipated particularly efficiently out of the joining layer itself into the semiconductor body, but the heat produced in the conversion plate during operation is also conducted away into the semiconductor body particularly efficiently via a joining layer that is as thin as possible. It is not possible, however, to design the wavelength-converting joining layer to be arbitrarily thin, because in order to attain a certain color location, for instance in the warm-white region of the CIE chromaticity diagram, a certain proportion of primary radiation in the first wavelength region must be converted by the phosphor particles in the wavelength-converting joining layer into radiation in the third wavelength region. Since the proportion of the radiation in the first wavelength region that is converted by the phosphor particles into radiation in the third wavelength region reduces with the thickness of the wavelength-converting joining layer, the wavelength-converting joining layer cannot be designed to be arbitrarily thin if the aim is to attain a specific color location in the warm-white region.

A lower limit to the thickness of the wavelength-converting joining layer preferably equals 5 micrometers, more preferably 8 micrometers.

According to an embodiment of the optoelectronic semiconductor chip, the radiation in the first wavelength region is blue light, the radiation in the second wavelength region is green or green-yellow light, and the radiation in the third wavelength region is red light. In other words, the semiconductor body preferably emits blue light, of which some is converted into green or green-yellow light by the conversion plate and some is converted into red light by the phosphor particles. In this embodiment, the semiconductor chip emits particularly preferably mixed-color light composed of blue light in the first wavelength region, green or green-yellow light in the second wavelength region and red light in the third wavelength region. The color location of the mixed-color light in this case preferably lies in the warm-white region of the CIE chromaticity diagram. In particular, a red component is needed in the mixed-color radiation in order to attain a warm-white color location.

The warm-white light preferably has a color temperature between 2000 K and 4500 K inclusive, more preferably between 2500 K and 3500 K inclusive.

Particularly preferably, the warm-white light has a color location that does not differ by more than 10 MacAdams ellipses from the color locations on the Planckian locus for a color temperature between 2000 K and 4500 K inclusive. In other words, the color location of the mixed-color light preferably lies in a range of +/−10 MacAdams ellipses about the Planckian locus at color temperatures between 2000 K and 4500 K inclusive.

Particularly preferably, the warm-white light has a color location that does not differ by more than 10 MacAdams ellipses from the color locations on the Planckian locus for a color temperature between 2500 K and 3500 K inclusive. In other words, the color location of the mixed-color light preferably lies in a range of +/−10 MacAdams ellipses about the Planckian locus at color temperatures between 2500 K and 3500 K inclusive.

The blue radiation in the first wavelength region preferably has a dominant wavelength between 400 nanometers and 480 nanometers inclusive, more preferably between 440 nanometers and 460 nanometers inclusive.

The green or green-yellow radiation in the second wavelength region preferably has a dominant wavelength between 520 nanometers and 580 nanometers inclusive, more preferably between 550 nanometers and 570 nanometers inclusive.

The red radiation in the third wavelength region preferably has a dominant wavelength between 590 nanometers and 650 nanometers inclusive, more preferably between 600 nanometers and 620 nanometers inclusive.

To determine the dominant wavelength of electromagnetic radiation, a straight line is drawn in the CIE chromaticity diagram from the white point through the color location of the radiation. The intersection of the straight line with the spectral locus bounding the CIE chromaticity diagram denotes the dominant wavelength of the electromagnetic radiation. In general, the dominant wavelength differs from a wavelength of maximum intensity.

When electromagnetic radiation is converted into electromagnetic radiation of longer wavelength, heat is produced that must be conducted away from the location of the conversion. If the heat is conducted away poorly, this reduces the conversion efficiency. Thus to increase the efficiency, particularly good heat dissipation from the conversion location is needed. One way of achieving good heat dissipation from the conversion location is to use ceramic or monocrystalline conversion plates, which allow better heat dissipation than, for instance, resin-based conversion elements, in which phosphor particles are introduced into a resin. Therefore a ceramic or monocrystalline conversion plate is also proposed here in order to achieve radiation in the second, for example green or green-yellow, wavelength region.

In principle it would be possible to use an additional conversion plate, which converts at least some of the radiation in the first wavelength region into radiation in the third, for example red, wavelength region. Although this allows improved heat dissipation, it considerably increases the complexity of assembling the conversion plates because they must both be positioned exactly. In addition, when stacking two different conversion plates, an additional adhesive layer is needed in order to affix the two conversion plates to one another. This additional adhesive layer in turn reduces the thermal conductance of the stacked conversion plates. Furthermore, the combination of a wavelength-converting joining layer with a ceramic or monocrystalline conversion plate for generating warm-white light has the advantage over stacked conversion plates that a large amount of the heat produced in the conversion is produced in the wavelength-converting joining layer and hence only needs to travel a shorter distance through the joining layer. Therefore the configuration proposed here of wavelength-converting joining layer and conversion plate can be superior to a stacked arrangement of two conversion plates. The same applies to an arrangement of a warm-white ceramic conversion plate affixed to a semiconductor body by a transparent joining layer.

One of the ideas espoused by the present application is to use for the conversion of primary radiation in a first wavelength region into radiation in a second wavelength region, a conversion plate that has improved heat dissipation, and to design the joining layer, which mechanically bonds the conversion plate to the radiation exit surface of the semiconductor body, to be a wavelength-converting joining layer. In order for the joining layer to have a wavelength-converting design, phosphor particles that convert primary radiation of the semiconductor body into electromagnetic radiation in a third wavelength region are introduced into the joining material of the joining layer. Thus in this case, in addition to performing the function of bonding semiconductor body and conversion plate mechanically to each other, the joining layer also performs the function of converting radiation from the semiconductor body.

The wavelength-converting joining layer, in which phosphor particles are incorporated in a joining material such as a silicone, has a higher thermal conductivity than a transparent joining layer that is made solely of the joining material such as a silicone and preferably contains no phosphor particles. The higher thermal conductivity results from the higher thermal conductivity of the phosphor particles compared with the thermal conductivity of the joining material. It is particularly preferred here that high concentrations of phosphor particles, for instance between 50 wt % and 70 wt % inclusive, are introduced into the joining material. Concentrations of phosphor particles at these high levels typically result in a 50% to 100% increase in the thermal conductivity of the wavelength-converting joining layer compared with a transparent joining layer without phosphor particles. Thus there is only a small difference between the thermal conductance of a wavelength-converting joining layer of approximate thickness 10 micrometers and the thermal conductance of a transparent joining layer of approximate thickness 5 micrometers.

It is also provided here to improve the heat dissipation from the wavelength-converting joining layer by limiting the thickness of said layer to no more than 30 micrometers.

As a result of the Stokes shift, a particularly large amount of heat is produced in converting blue light into red light, which must be conducted away by the phosphor particles. Thus in particular for the situation in which the phosphor particles in the wavelength-converting joining layer convert blue light into red light, a small thickness of the wavelength-converting joining layer is particularly useful for improving the heat dissipation.

The phosphor particles particularly preferably comprise or are made of a phosphor that is doped with europium as activator, where the concentration of the europium equals preferably at least 1 mol %, preferably at least 1.5 mol %, preferably at least 2 mol % and more preferably at least 3 mol %. The activator of a phosphor is usually a foreign ion that is introduced into a host lattice and occupies a lattice site there. The activator ions form the active part of the phosphor. They are shifted into an excited electronic state by the incident electromagnetic radiation, also called the primary radiation. The activator ion returns to its ground state by emitting electromagnetic radiation. The emitted radiation is the converted radiation in the second wavelength region. This radiation usually has a longer wavelength than the incident radiation.

The portion of primary, for instance blue, radiation in the first wavelength region that is absorbed by the phosphor particles is approximately proportional to the concentration of activator ions, for instance europium ions, because these ions form the optically active part of the phosphor. The greater the concentration of activator ions in the phosphor, the smaller the amount of phosphor needed for the required conversion rate. Thus by using a higher doping level of activator ions it is advantageously possible to achieve a thinner wavelength-converting joining layer, which ensures a better thermal interface between the conversion plate and the semiconductor body than a thicker wavelength-converting joining layer.

An $(Sr,Ca)AlSiN_3$ phosphor or a 226 phosphor is suitable, for example, as a phosphor. These phosphors are particularly preferable as phosphors suitable for converting blue light into red light.

A 226 phosphor, for example, is a phosphor containing an inorganic substance that includes in its composition at least the element D, the element Al, the element AX, the element SX and the element NX, where: D represents one, two or more elements from the group Mn, Ce, Pr, Nd, Sm, Eu, Tb, Dy, Ho, Er, Tm, alkali metals (Li, Na, K, Rb, Cs) and Yb; Al represents one, two or more elements from the group of divalent metals that are not included in D; SX represents one, two or more elements from the group of tetravalent metals; AX represents one, two or more elements from the group of trivalent metals; and NX represents one, two or more elements from the group O, N, S, C, Cl, F. The 226 phosphors in this case have the same crystal structure as $Sr(Sr_aCa_{1-a})Si_2Al_2N_6$.

A 226 phosphor which "has the same crystal structure as $Sr(Sr_aCa_{1-a}) Si_2Al_2N_6$" is defined below as a 226 phosphor which can be described not only in the space group $P2_1$ but also in one of the space groups 1 to 3 as defined in the International Tables of Crystallography, Volume A, i.e. in the following space groups: P1, P2, P1, and the length of its chemical bonds between the elements Al—N and Si—N is calculated from the lattice constants and atom coordinates using a Rietveld refinement to lie within a figure of ±15% of the values specified in FIG. 7.

According to another embodiment of the present invention, the space group of the 226 phosphor is monoclinic $P2_1$.

Particularly preferably, the crystal structure of the 226 phosphor has a unit cell that is twice the size compared with the crystal structure of an $(Sr,Ca)AlSiN_3$ phosphor.

As a result of its crystallographic structure, a 226 phosphor is suitable in particular for being provided with a comparatively high level of europium doping. The 226 phosphor is doped preferably with at least 1 mol %, preferably with at least 1.5 mol %, preferably with at least 2 mol % and more preferably with at least 3 mol %. Unlike an $(Sr,Ca)AlSiN_3$ phosphor, for example, it is possible to provide a 226 phosphor with the stated high europium doping levels because for a 226 phosphor, unlike an $(Sr,Ca)AlSiN_3$ phosphor, there is no reduction in the efficiency with europium doping levels above 1 mol %. The reason for this is the modified crystal structure of the 226 phosphor, which provides the activator atom with a larger amount of space.

In addition, a 226 phosphor can also have the general formula $Sr(Sr_aM_{1-a})Si_2Al_2(N,X)_6$:D,A,B,E,G,L, where M is selected from Ca, Ba, Mg alone or in combination, and A is selected from divalent metals that are different from M and D. B here represents trivalent metals, E here represents monovalent metals, G here represents tetravalent elements and L here represents trivalent elements. The term "226 phosphor" is obtained here from the proportions of silicon, aluminum and nitride according to the stated stoichiometric formula.

A 226 phosphor particularly preferably has the general chemical formula $Sr(Sr_aM_{1-a}) Si_2Al_2N_6$:D, where M is selected from the group Ca, Ba, Zn, Mg and/or Li; D is preferably selected from the group Mn, Ce, Pr, Nd, Sm, Eu, Tb, Dy, Ho, Er, Tm and Yb. Particularly preferably, D=Ce and Eu.

A 226 phosphor for the emission of red light for example has the general chemical formula $Sr_xCa_{1-x}AlSiN_3$:Eu, where $0.8 \leq x \leq 1$, where between 0.1% and 5% inclusive of the Sr, Ca and/or Sr/Ca lattice sites are replaced by Eu, and where in X-ray crystallography, the phosphor exhibits in the orthorhombic description a reflex having the Miller index 121.

According to one embodiment, the composition of a 226 phosphor can be defined by the chemical formula $Sr(Sr_aCa_{1-a})Si_2Al_2N_6$:Eu. This corresponds to the nominal composition of the phosphor according to the composition of the weighed sample. The Si:Al ratio that actually exists may also differ from 2:2, however, which can be expressed by a parameter d. A possible value for d lies, for example, between 0 and 0.1, including boundary values. It is not possible to distinguish Si and Al radiographically.

It is likewise possible that the finished phosphor contains other additional elements, for instance introduced via impurities or flux in the initial mixture or during synthesis, in particular (but not exclusively) the elements boron and/or carbon and/or oxygen and/or halogens such as fluorine or chlorine, for example. Individual components may evaporate and thereby result in statistical under-occupancies of individual sites. This effect is also impossible to detect, or only possible with great difficulty, using radiographic analysis. Thus a chemical formula of the type $Sr_{1-e}(Sr_aCa_{1-a})_{1-g}(Si,C)_{2+d}(Al,B)_{2-d}(N,O,F,Cl,C)_6$:Eu can also be a possible description of a 226 phosphor that actually exists.

Document PCT/EP2014/071544 describes 226 phosphors, the disclosure of which document is included in the present application hereby explicitly by reference. In particular, the parts of document PCT/EP2014/071544 that relate to the above-mentioned phosphors, to the properties thereof and to the method for producing same are included in the present application explicitly by reference.

Particularly preferably, the phosphor particles are made of a 226 phosphor. 226 phosphors advantageously have a particularly narrowband emission spectrum, which, compared with conventional red phosphors, have a better overlap with the spectral sensitivity of the human eye. Together with a green or green-yellow emitting phosphor and a primary blue excitation radiation, 226 phosphors are therefore suitable for producing warm-white light efficiently.

Thus phosphor particles made of a 226 phosphor can be used advantageously to form a particularly thin wavelength-converting joining layer that still converts sufficient radiation from the semiconductor body from the first, blue wavelength region into radiation in the third, preferably red, wavelength region in order to attain a desired color location, for instance in the warm-white region.

According to a particularly preferred embodiment of the optoelectronic semiconductor chip, the phosphor particles comprise a 226 phosphor or are made of a 226 phosphor, and the wavelength-converting joining layer has a thickness of 15 micrometers maximum, preferably of 10 micrometers maximum.

Particularly preferably, there is a relatively high concentration of the phosphor particles in the wavelength-converting joining layer. Particularly preferably, the concentration of the phosphor particles in the wavelength-converting joining layer lies between 50 wt % and 70 wt % inclusive. A high concentration of phosphor particles advantageously results in improved heat dissipation out of the wavelength-converting joining layer.

Particularly preferably, the phosphor particles have a diameter that does not exceed the thickness of the wavelength-converting joining layer.

To produce an optoelectronic semiconductor chip, a joining material is provided, in which are incorporated phosphor particles. For example, phosphor particles are first introduced into a joining material such as a resin. Alternatively, a conversion film can also be provided as the joining material. A conversion film that is suitable for use as a joining material comprises, for example, a pre-cured resin, for instance a silicone, in which the phosphor particles are incorporated. Although particularly preferably the conversion film is pre-cured, the curing process is not yet fully complete. Such a conversion film containing a pre-cured resin is advantageously adhesive and can therefore be used as a joining material.

Using a conversion film as the joining material provides the advantage of allowing good control over the quantity of phosphor particles introduced into the wavelength-converting joining layer. This allows semiconductor chips to be produced for which the color location of the emitted radiation can be set particularly precisely.

In a next step, the joining material containing the phosphor particles is applied to a radiation exit surface of a semiconductor body. Alternatively, it is also possible to apply the joining material to a main face of the conversion plate.

Finally, a ceramic or monocrystalline conversion plate or a semiconductor body is placed on the joining material, and the joining material is fully cured. This produces a wavelength-converting joining layer that bonds the conversion plate to the radiation exit surface of the semiconductor body.

The joining material containing the phosphor particles can be applied to the radiation exit surface of the semiconductor body, for example, by a spray-coating technique or by printing. Printing the joining material also allows semiconductor chips to be produced for which the color location of the emitted radiation can be set particularly precisely.

A solvent such as toluene, for example, can be added to the joining material containing the phosphor particles in order to adjust the viscosity to an appropriate level.

According to one embodiment, the ceramic or monocrystalline conversion plate comprises or is made of one of the following phosphors: YAG, LuYAG or LuAG. The conversion plate preferably comprises or is made of a phosphor having the chemical formula $(Lu,Y)_3(Al,Ga)_5O_{12}:Ce^{3+}$. Particularly preferably, the ceramic or monocrystalline conversion plate comprises or is made of one of the following phosphors: $Lu_3Al_5O_{12}:Ce^{3+}$, $Y_3Al_5O_{12}:Ce^{3+}$, $(Lu,Y)_3Al_5O_{12}:Ce^{3+}$, $Y(Al,Ga)_5O_{12}:Ce^{3+}$, $(Lu,Y)_3(Al,Ga)_5O_{12}:Ce^{3+}$.

These phosphors are suitable particularly for converting primary radiation from the blue wavelength region into green or yellow-green radiation in a second wavelength region.

It is also possible to define a conversion element based on a ceramic or monocrystalline conversion plate suitable for converting electromagnetic radiation in a first wavelength region into electromagnetic radiation in a second wavelength region, which differs from the first wavelength region. The conversion element comprises in addition to the conversion plate a conversion layer, which is made of a resin and in which are incorporated phosphor particles. Said conversion layer is applied to a main face of the conversion plate. The conversion layer is preferably in direct contact with the conversion plate. Particularly preferably, the conversion layer has a thickness that is not greater than 30 micrometers. In this embodiment, the conversion element can be produced spatially separately from the semiconductor body.

The conversion element espouses the idea of applying onto the ceramic conversion plate a very thin conversion layer for converting primary radiation in a first, preferably blue, wavelength region into a third, preferably red, wavelength region. In other words, a resin layer filled with phosphor particles, as already described above as a wavelength-converting joining layer, is applied to the conversion plate. Unlike the semiconductor chip described above, in which the resin layer filled with phosphor particles is used simultaneously both for wavelength conversion and for affixing the conversion plate, the conversion layer for the conversion element is intended only for wavelength conversion. In other respects, the features described earlier in connection with the wavelength-converting joining layer can likewise be embodied in the conversion layer.

The conversion element is formed particularly preferably from the conversion plate and the conversion layer.

In particular, the conversion element is preferably suitable, combined with a semiconductor body which emits blue light as the electromagnetic radiation in the first wavelength region, to emit mixed-color radiation from the warm-white region of the CIE chromaticity diagram.

The conversion element has the advantage that its wavelength-converting properties can be characterized before it is mounted on a semiconductor body. Thus a plurality of conversion elements can be sorted according to color locations attained.

An optoelectronic semiconductor chip comprises, for example, a semiconductor body suitable for emitting electromagnetic radiation in a first, preferably blue, wavelength region from a radiation exit surface.

In addition, the optoelectronic semiconductor chip preferably comprises a conversion element. The conversion element is preferably arranged after the semiconductor body in the main emission direction of said semiconductor body. The conversion element is mounted particularly preferably on the radiation exit surface of the semiconductor body. In this case, the conversion element is arranged particularly preferably such that the conversion layer faces the radiation exit surface of the semiconductor body.

Particularly preferably, the conversion element is affixed on the radiation exit surface of the semiconductor body by a transparent joining layer. Said transparent joining layer is preferably in direct contact with the radiation exit surface of the semiconductor body and with the conversion layer of the conversion element. The transparent joining layer particularly preferably is transparent to visible light, and in particular has no wavelength-conversion properties. The transparent joining layer comprises or is made of silicone, for example. Particularly preferably, the transparent joining layer is not thicker than 5 micrometers.

Further advantageous embodiments and developments of the invention appear in the exemplified embodiments described below in connection with the figures.

A method for producing an optoelectronic semiconductor chip according to an exemplified embodiment is described with reference to the schematic sectional views in FIGS. 1 to 3, where.

In the figures, the same reference numbers are used to denote identical, similar or equivalent elements. The figures and the relative sizes of the elements illustrated in the figures shall not be considered to be to scale. Indeed individual elements, in particular layer thicknesses, may be shown exaggeratedly large in order to improve visualization and/or understanding.

Figure 1:
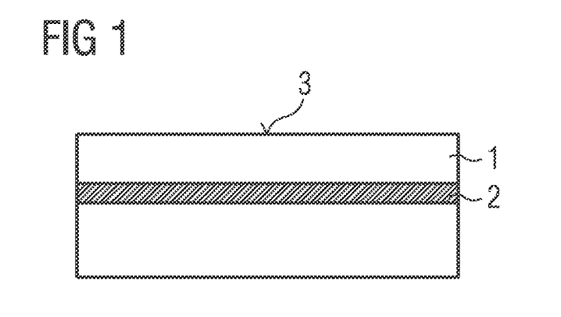
Figure 2:
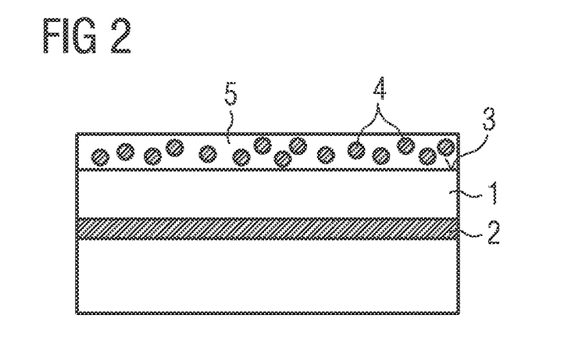
Figure 3:
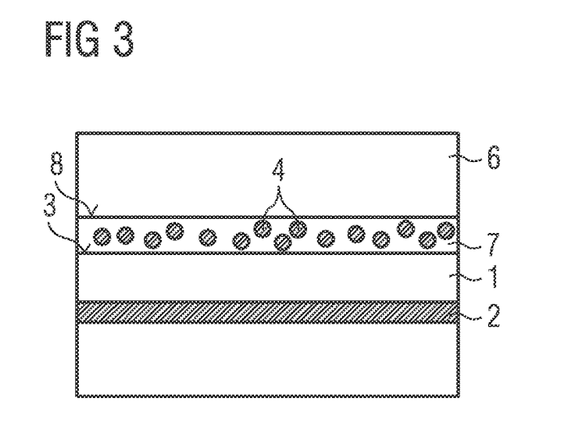
FIG. 3 shows a schematic sectional view of a finished optoelectronic semiconductor chip according to a first exemplified embodiment.

In the method according to the exemplified embodiment of FIGS. 1 to 3, a semiconductor body 1 is first provided. The semiconductor body 1 comprises an active zone 2 suitable for emitting electromagnetic radiation in a first wavelength region from a radiation exit surface 3 of the semiconductor body 1 (FIG. 1). The semiconductor body 1 in this case emits blue light having a dominant wavelength of 450 nanometers. The semiconductor body 1 is here based on a nitride compound semiconductor material. Nitride compound semiconductor materials are compound semiconductor materials that contain nitrogen, for instance materials from the system $In_xAl_yGa_{1-x-y}N$, where $0 \leq x \leq 1$, $0 \leq y \leq 1$ and $x+y \leq 1$.

In a next step, phosphor particles 4 are introduced into a joining material, for instance a silicone (process not shown). The phosphor particles 4 here comprise or are made of a CaAlSiN phosphor. The CaAlSiN phosphor is given by the formula $(Sr,Ca)AlSiN_3$, for example, and is suitable for converting blue light emitted by the semiconductor body 1 into red light having a dominant wavelength of 603 nanometers. The diameter of the phosphor particles 4 does not exceed 20 micrometers.

The joining material containing the phosphor particles 4 is applied to the radiation exit surface 3 of the semiconductor body 1 as a layer 5, for instance by means of spray-coating (FIG. 2)

Then a ceramic or monocrystalline conversion plate 6 is placed on the layer 5 made of the joining material containing the phosphor particles 4. The conversion plate 6 is suitable for converting radiation in the first wavelength region, so in this case blue light from the semiconductor body 1, into green or green-yellow radiation.

Finally, the joining material is cured and a wavelength-converting joining layer 7 is produced which bonds the semiconductor body 1 to the conversion plate 6 in a mechanically robust manner (FIG. 3). The wavelength-converting joining layer 7 has a thickness of approximately 20 micrometers. The concentration of the phosphor particles 4 inside the wavelength-converting joining layer 7 in this embodiment equals approximately 54 wt %.

The conversion plate 6 comprises or is made of a phosphor that has the following formula: $Lu_3Al_5O_{12}:Ce^{3+}$, where the Ce content equals 1 mol %.

The optoelectronic semiconductor chip according to the exemplified embodiment in FIG. 3 emits during operation mixed-color radiation consisting of primary blue light from the semiconductor body 1, red light converted by the phosphor particles 4, and green/green-yellow light converted by the conversion plate 6. The CRI value (Color Rendering Index) of this light equals approximately 92. Particularly preferably, the mixed-color light has a color location in the warm-white region of the CIE chromaticity diagram of 2700 K, for example.

A simulation of the temperature at a main face 8 of the wavelength-converting joining layer 7, assuming an ambient temperature of 80° C. and a current density inside the semiconductor body 1 of 2 A/mm², yields a value of approximately 155° C. This simulation is based on the conversion losses inside the wavelength-converting joining layer 7, which are converted into heat. Although a temperature of 155° C. lies close to the maximum permitted continuous operating temperature of silicone of 160° C., it does not exceed it. In addition, the semiconductor chip can be subjected to higher current densities than semiconductor chips having purely resin-based, thick conversion layers, which typically have maximum current densities of 1 A/mm² to 1.5 A/mm². Thus not only is the optoelectronic semiconductor chip according to the exemplified embodiment in FIG. 3 suitable for efficient emission of warm-white light of high color rendering index and high luminance, but furthermore it also has a long lifetime.

Figure 4:
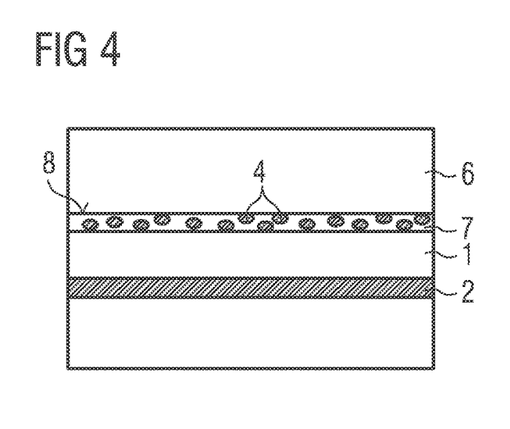
FIG. 4 shows a schematic sectional view of an optoelectronic semiconductor chip according to another exemplified embodiment.

Unlike the optoelectronic semiconductor chip according to the exemplified embodiment in FIG. 3, the optoelectronic semiconductor chip according to the exemplified embodiment in FIG. 4 comprises phosphor particles 4 in the wavelength-converting joining layer 7 that comprise a 226 phosphor or are made of a 226 phosphor. The 226 phosphor, when excited with blue light from the semiconductor body 1, emits red light having a dominant wavelength of 601 nanometers. The diameter of the phosphor particles 4 does not exceed 10 micrometers in this case. The thickness of the wavelength-converting joining layer 7 is accordingly also not greater than 10 micrometers. Such a reduction in the thickness of the wavelength-converting joining layer 7 would not be possible for the exemplified embodiment shown in FIG. 3 because the CaAlSiN phosphor used there does not have a sufficient conversion rate. The concentration of the phosphor particles 4 in the wavelength-converting joining layer 7 here has a value of approximately 59 wt %. The mixed-color light, which consists of blue light from the semiconductor body 1, green/green-yellow light from the conversion plate 6 and red light from the phosphor particles 4 and is emitted by the semiconductor chip shown in FIG. 4, has a CRI value of approximately 93.

A simulation of the temperature of a main face 8 of the wavelength-converting joining layer 7 of the semiconductor chip according to exemplified embodiment in FIG. 4 yields a maximum value of 146° C. This means that the optoelectronic semiconductor chip could be operated at a 10° C. higher ambient temperature than the semiconductor chip according to the exemplified embodiment in FIG. 3. Alternatively, the current density to which the semiconductor chip is subjected could be increased by 10% to 2.2 A/mm². Using said altered values yields in each case a simulated temperature of 155° C. as the maximum temperature of the wavelength-converting joining layer 7.

Figure 5:
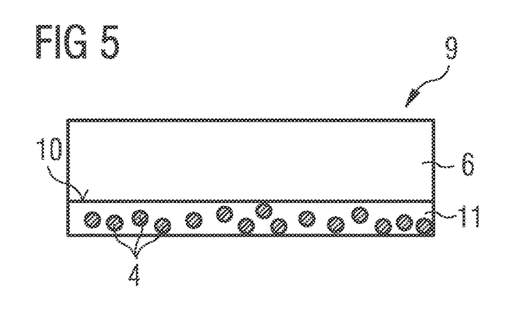
FIG. 5 shows a schematic sectional view of a conversion element according to an exemplified embodiment.

The conversion element 9 according to the exemplified embodiment in FIG. 5 comprises a ceramic or monocrystalline conversion plate 6 suitable for converting radiation in a first wavelength region, preferably blue light, into radiation in a second wavelength region, preferably green/green-yellow light. A conversion layer 11 is applied to a main face 10 of the conversion plate 6. The conversion layer 11 is made of a resin in which are incorporated phosphor particles 4. The phosphor particles 4 are suitable for converting radiation in the first wavelength region into radiation in a third wavelength region, preferably into red light. In this case, the thickness of the conversion layer 11 particularly preferably has a value that is not greater than 30 micrometers, and particularly preferably is not greater than 20 micrometers.

Figure 6:
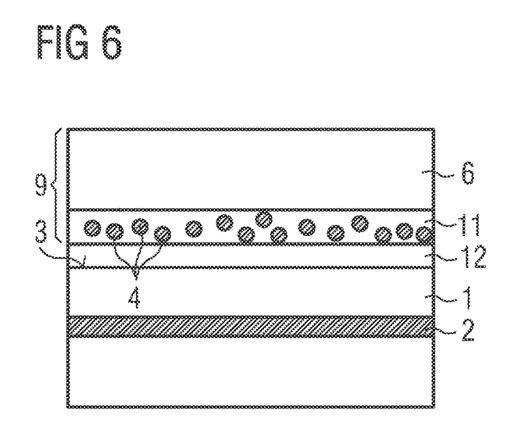
FIG. 6 shows a schematic sectional view of an optoelectronic semiconductor chip according to another exemplified embodiment.

The optoelectronic semiconductor chip according to the exemplified embodiment in FIG. 6 comprises a semiconductor body 1 such as that already described with reference to FIG. 1. A conversion element 9, such as that already described with reference to FIG. 5, is applied to the radiation exit surface 3 of the semiconductor body 1. The conversion element 9 is affixed to the radiation exit surface 3 of the semiconductor body 1 by a transparent joining layer 12, for instance made of silicone. Said transparent joining layer 12 is in direct contact both with the radiation exit surface 3 of the semiconductor body and with the conversion layer 11 of the conversion element 9. Particularly preferably, the thickness of the transparent joining layer 12 is no greater than 5 micrometers.

Figure 7:
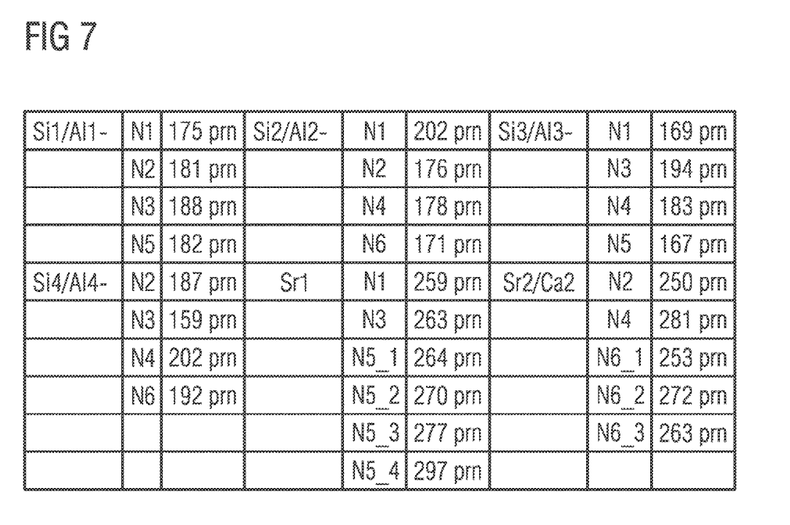
FIGS. 7 to 10 are used to describe phosphors in greater detail and how they can be used in the present case.

FIG. 7 shows in detail main interatomic distances for a 226 phosphor $Sr(Sr_aCa_{1-a})Si_2Al_2N_6$. In direct comparison with nitrides of similar composition, e.g. $SrAlSiN_3$ (ICSD 419410), $CaAlSiN_3$ (ICSD 161796) or $(Sr,Ca)AlSiN_3$ (ICSD 163203) it can be observed that there is a slightly larger and a slightly smaller environment around the alkaline earth atoms Sr and Ca. In $SrAlSiN_3$, $CaAlSiN_3$ and $(Sr,Ca)AlSiN_3$, for the alkaline earth atoms there is only a 5-fold coordination with a mean Sr—N distance of 267 pm. In the structure of a 226 phosphor $Sr(Sr_aCa_{1-a})Si_2Al_2N_6$, Sr1 forms a 6-fold coordination with a mean Sr1-N distance of 272 pm, Sr2/Ca2 forms a 5-fold coordination with a mean Sr2/Ca2-N distance of 264 pm.

Figure 8:
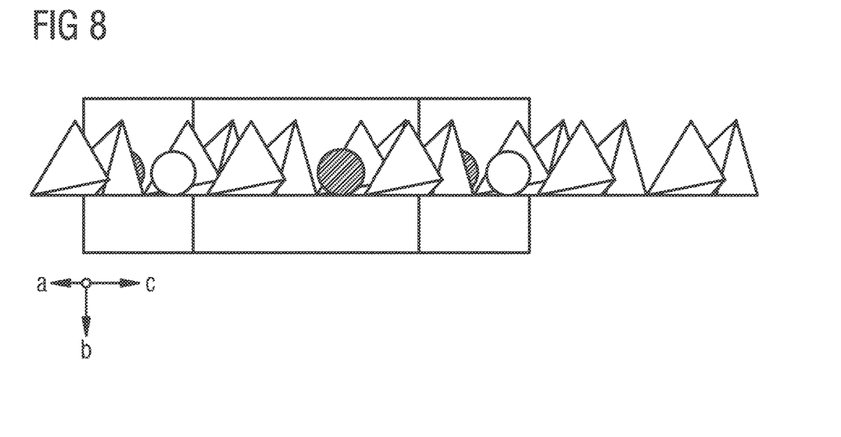
Figure 9:
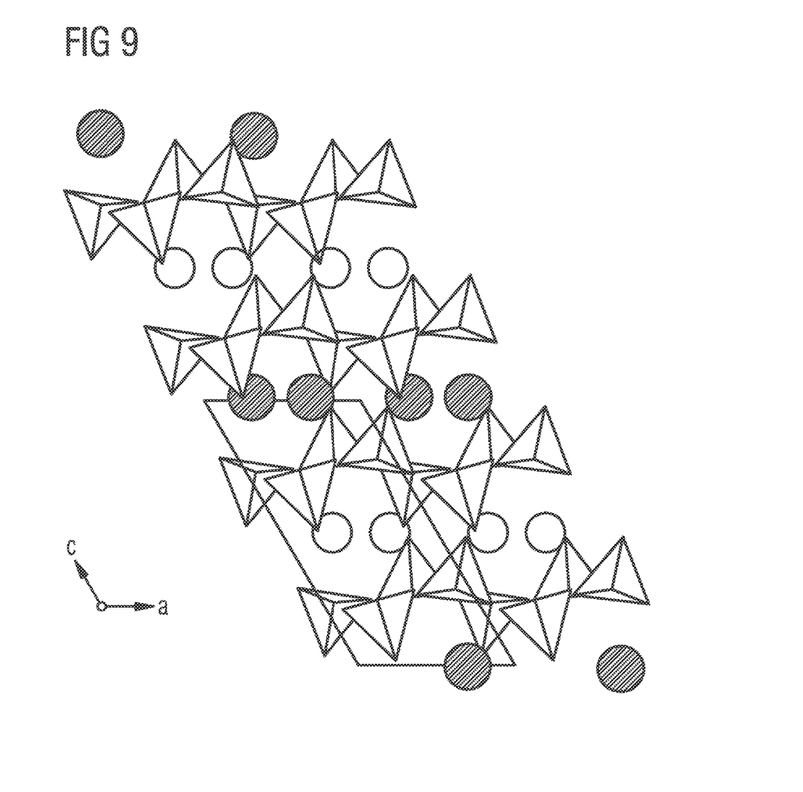

FIGS. 8 and 9 are used to describe in greater detail the structure of a 226 phosphor type $Sr(Sr_aCa_{1-a})Si_2Al_2N_6$. FIG. 8 shows a view towards the layers of $Sr(Sr_aCa_{1-a})Si_2Al_2N_6$. The layers are derived from AlN. The tetrahedra here symbolize $(Si/Al)N_4$ groups. Compared with AlN there are individual tetrahedra missing that have been replaced by an alkaline earth ion (white circles for Sr alone and black circles for a mix of Sr/Ca). The tetrahedra are considerably distorted compared with AlN. All the bond lengths and angles, however, are similar to those in other nitridosilicates.

FIG. 9 shows a 226 phosphor $Sr(Sr_aCa_{1-a})Si_2Al_2N_6$ from the [010] direction. It clearly shows the 3D spatial network of the $(Si/Al)N_4$ tetrahedra. Layers extend in the a-c plane that are linked in the b-direction (not shown) into a 3D network. Embedded therebetween are located layers containing alternately the pure Sr sites (shown as white circles) and the mixed-occupancy Sr/Ca sites (shown as black circles).

Figure 10:
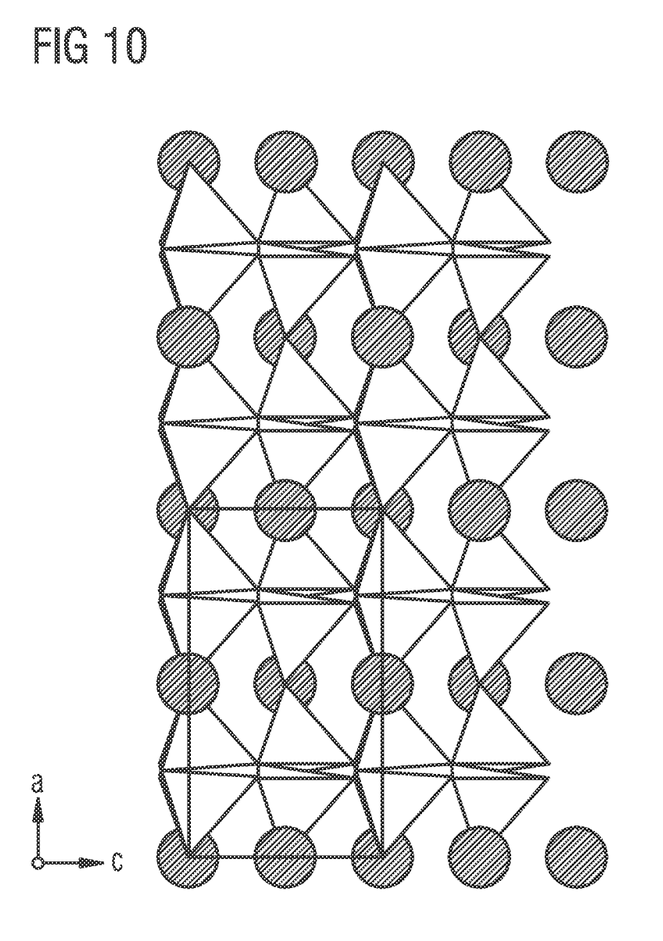

FIG. 10 shows from the [010] direction for comparison the structure of $(Sr_{0.846}Ca_{0.211})AlSiN_3$ (ICSD 163203) known form the literature. In this case, all the Sr/Ca sites (black) are mixed-occupancy. There are no pure Sr sites.

This re-arrangement for the 226 phosphor $Sr(Sr_aCa_{1-a})Si_2Al_2N_6$:Eu into sites with mixed Sr/Ca occupancy and sites fully occupied solely by Sr is advantageous e.g. compared with the structure of $(Sr,Ca)AlSiN_3$ (cf. FIG. 10) in which there is only a mixed-occupancy site available for the activator atoms (dopant), which results in widening of emission, which of course is based on the interaction between the activator and the surrounding host lattice, and in more pronounced quenching properties. The structure of a 226 phosphor $Sr(Sr_aCa_{1-a})Si_2Al_2N_6$:Eu, on the other hand, provides the activator, in this case preferably Eu, with an excellent Sr site, without any disordering and its associated disadvantages. The improved properties of the luminescence can be explained loosely by this structure. According to this model representation, the Eu mainly occupies only the pure Sr plane and occupies the mixed plane rather less.

Based on FIG. 9, it is also possible to represent a phosphor of lower symmetry corresponding to the space groups 1 to 3 of the International Tables of Crystallography, Volume A, i.e. the space groups P1, P$\bar{1}$, P2, by, for example, splitting the mixed layer into planes of different occupancy (in part) according to pure Sr along with mixed occupancy.

The present application claims priority from German application DE 10 2014 117 448.8, the disclosure of which is hereby included by reference.

The description based on the exemplified embodiments has no limiting effect on the invention. Instead, the invention includes every novel feature and every combination of features, which in particular includes every combination of features in the claims, even if this feature or combination is not itself explicitly mentioned in the claims or exemplified embodiments.

The invention claimed is:

1. An optoelectronic semiconductor chip comprising:
   a semiconductor body suitable for emitting electromagnetic radiation in a first wavelength region from a radiation exit surface;
   a ceramic or monocrystalline conversion plate suitable for converting electromagnetic radiation in the first wavelength region into electromagnetic radiation in a second wavelength region, which differs from the first wavelength region; and
   a wavelength-converting joining layer that bonds the conversion plate to the radiation exit surface,
   wherein the wavelength-converting joining layer comprises phosphor particles which are suitable for converting radiation in the first wavelength region into radiation in a third wavelength region, which differs from the first wavelength region and from the second wavelength region,
   wherein the phosphor particles have the general chemical formula $Sr_xCa_{1-x}AlSiN_3$:Eu, where $0.8<x<1$, where between 0.1% and 5% of the Sr, Ca and/or Sr/Ca lattice sites are replaced by Eu, and where in X-ray crystallography, the phosphor exhibits in the orthorhombic description a reflex having the Miller index 1$\bar{2}$1,
   wherein the wavelength-converting joining layer has a thickness between at least 5 micrometers and at most 30 micrometers; and
   wherein the concentration of the phosphor particles in the wavelength-converting joining layer is between 50 wt % and 70 wt %.

2. The optoelectronic semiconductor chip as claimed in the claim 1, wherein the wavelength-converting joining layer has a maximum thickness of 10 micrometers.

3. The optoelectronic semiconductor chip as claimed in claim 1, wherein the radiation in the first wavelength region is blue light, the radiation in the second wavelength region is green or green-yellow light, and the radiation in the third wavelength region is red light.

4. The optoelectronic semiconductor chip as claimed in claim 1, wherein the phosphor particles are doped with europium as activator, where the concentration of the europium equals at least 1 mol %.

5. The optoelectronic semiconductor chip as claimed in claim 1, wherein phosphor particles are doped with europium as activator, where the concentration of the europium equals at least 1 mol %, and
wherein and the wavelength-converting joining layer has a maximum thickness of 15 micrometers.

6. The optoelectronic semiconductor chip as claimed in claim 1, which emits mixed-color radiation composed of radiation in the first, the second and the third wavelength region, wherein a color location of the mixed-color radiation lies in the warm-white region.

7. An optoelectronic semiconductor chip comprising:
a semiconductor body suitable for emitting electromagnetic radiation in a first wavelength region from a radiation exit surface;
a ceramic or monocrystalline conversion plate suitable for converting electromagnetic radiation in the first wavelength region into electromagnetic radiation in a second wavelength region, which differs from the first wavelength region; and
a wavelength-converting joining layer that bonds the conversion plate to the radiation exit surface,
wherein the wavelength-converting joining layer comprises phosphor particles which are suitable for converting radiation in the first wavelength region into radiation in a third wavelength region, which differs from the first wavelength region and from the second wavelength region,
wherein the wavelength-converting joining layer has a thickness between at least 5 micrometers and at most 30 micrometers, and
wherein the phosphor particles have the general chemical formula $Sr_xCa_{1-x}AlSiN_3$:Eu, where $0.8<x<1$, where between 0.1% and 5% of the Sr, Ca and/or Sr/Ca lattice sites are replaced by Eu, and where in X-ray crystallography, the phosphor exhibits in the orthorhombic description a reflex having the Miller index $1\bar{2}1$, where the concentration of the europium equals at least 1 mol %, and
wherein the concentration of the phosphor particles in the wavelength-converting joining layer is between 50 wt % and 70 wt %.

8. The optoelectronic semiconductor chip according to claim 1, wherein the phosphor particles are doped with europium as activator, where the concentration of the europium is at least 3 mol %.

9. The optoelectronic semiconductor chip according to claim 7, wherein the phosphor particles are doped with europium as activator, where the concentration of the europium is at least 3 mol %.

\* \* \* \* \*